United States Patent [19]

Vij

[11] Patent Number: 5,682,098
[45] Date of Patent: Oct. 28, 1997

[54] OPEN QUADRATURE WHOLE VOLUME IMAGING NMR SURFACE COIL ARRAY INCLUDING THREE FIGURE-8 SHAPED SURFACE COILS

[75] Inventor: Kamal Vij, Phoenix, Ariz.

[73] Assignee: W. L. Gore & Associates, Inc., Newark, Del.

[21] Appl. No.: 584,847

[22] Filed: Jan. 11, 1996

[51] Int. Cl.$^6$ .................................. G01R 33/3415
[52] U.S. Cl. ........................................ 324/318
[58] Field of Search .................. 324/318, 322, 324/307, 300; 128/653.2, 653.5; 335/216

[56] References Cited

U.S. PATENT DOCUMENTS

| | | |
|---|---|---|
| 4,680,548 | 7/1987 | Edelstein et al. . |
| 4,692,705 | 9/1987 | Hayes . |
| 4,694,255 | 9/1987 | Hayes . |
| 4,799,016 | 1/1989 | Rezvani . |
| 4,825,162 | 4/1989 | Roemer et al. . |
| 4,943,775 | 7/1990 | Boskamp et al. ................ 324/322 |
| 4,973,908 | 11/1990 | Bottomley et al. ............. 324/318 |
| 5,208,534 | 5/1993 | Okamoto et al. ............... 324/309 |
| 5,256,971 | 10/1993 | Boskamp ......................... 324/318 |
| 5,277,183 | 1/1994 | Vij . |
| 5,370,118 | 12/1994 | Vij . |
| 5,471,142 | 11/1995 | Wang ............................... 324/318 |
| 5,548,218 | 8/1996 | Lu ................................... 324/318 |

Primary Examiner—Sandra L. O'Shea
Assistant Examiner—Roger Phillips
Attorney, Agent, or Firm—Victor M. Genco, Jr.

[57] ABSTRACT

A whole volume quadrature coil is provided which has one side and two ends thereof open for easy patient access. The coil is comprised entirely of figure eight shaped coils.

8 Claims, 12 Drawing Sheets

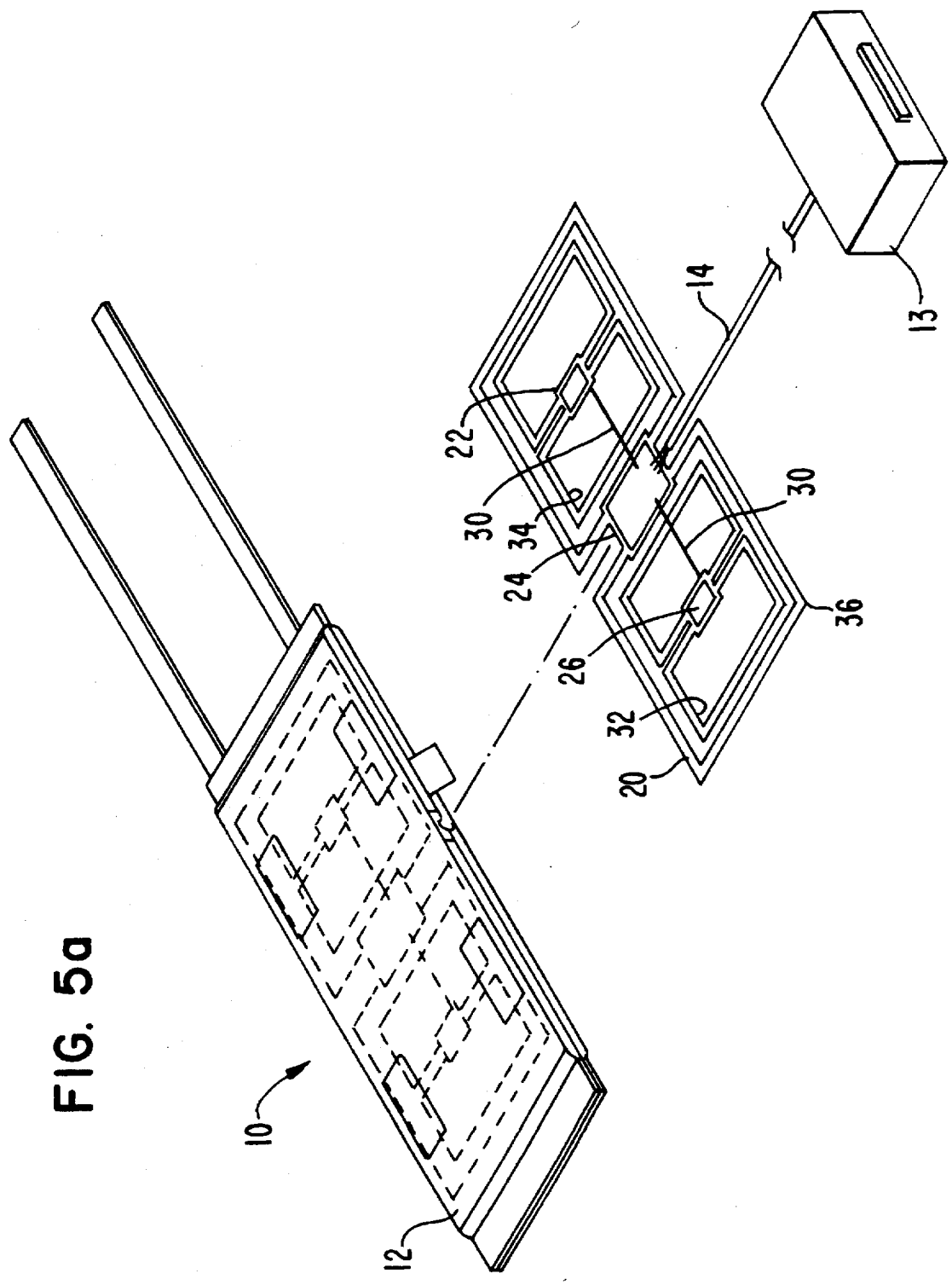

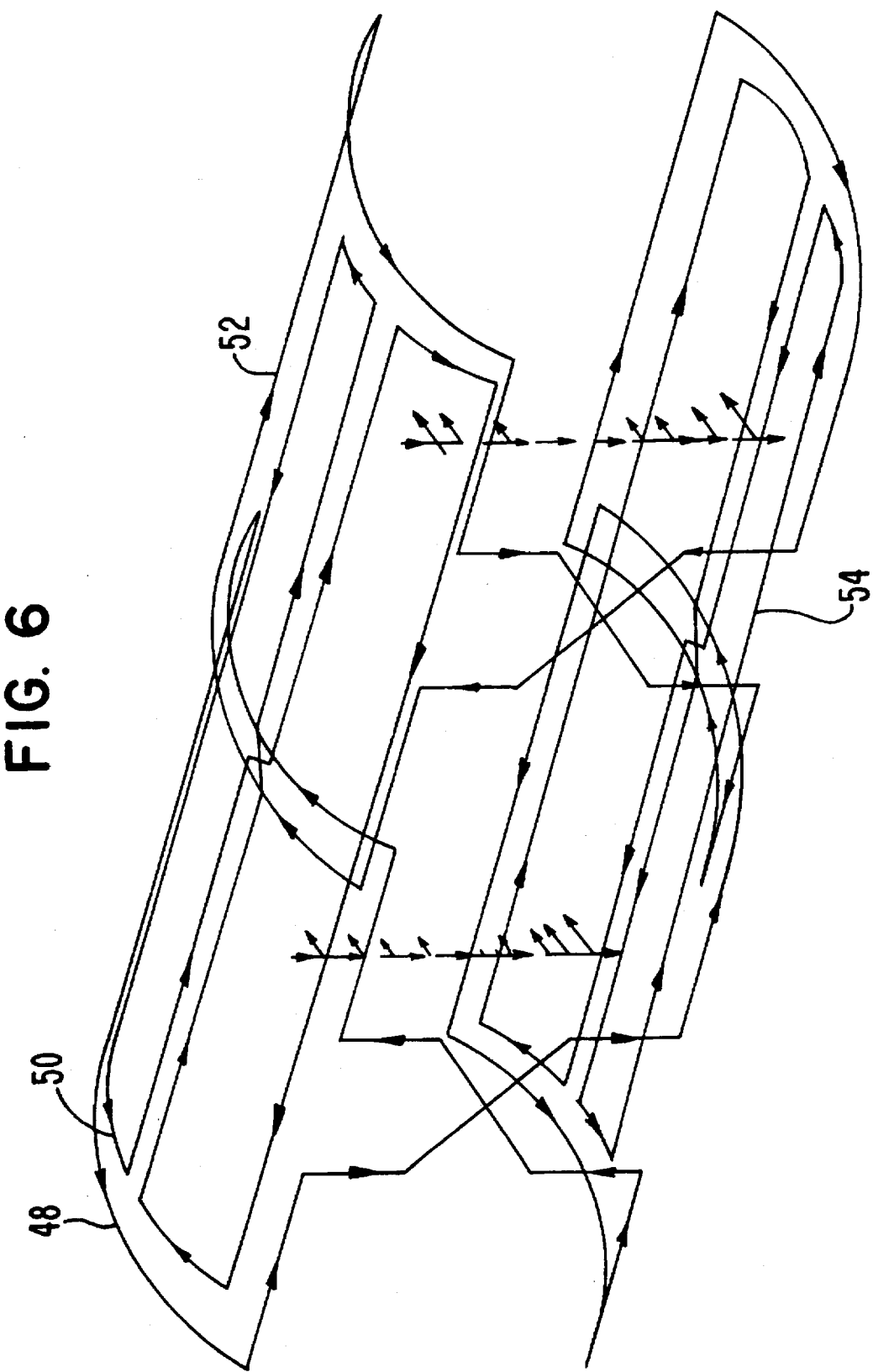

OPEN QUADRATURE WHOLE VOLUME IMAGING NMR SURFACE COIL ARRAY INCLUDING THREE FIGURE-8 SHAPED SURFACE COILS

FIELD OF THE INVENTION

This invention generally relates to the field of magnetic resonance imaging (MRI), also known as nuclear magnetic resonance (NMR) imaging. More particularly, the present invention relates to an open, whole volume, general purpose, quadrature radio frequency (RF) surface coil array comprised entirely of figure eight shaped coils for magnetic resonance imaging.

BACKGROUND OF THE INVENTION

A conventional MRI imaging system is comprised of at least in part a super conducting magnet that generates a static, highly homogenous magnetic field $B_o$; a gradient coil system that generates gradient fields $G_x$, $G_y$, and $G_z$ in the X, Y, and Z directions; a body coil that generates polarized RF excitations and that also detects RF signals; and a signal detection and image reconstruction system that generates suitable images of an object to be viewed.

The phenomenon of NMR occurs when atomic nuclei, having unpaired protons or neutrons, are placed in the $B_o$ magnetic field. These nuclei align parallel or opposite to the $B_o$ magnetic field. A greater number of the nuclei align in the parallel direction to the $B_o$ magnetic field resulting in a net magnetization $M_o$. These nuclei also precess about an axis of the $B_o$ magnetic field. This angular precession frequency $\omega$ is related to the static magnetic field $B_o$ by the following relationship, which is called the Larmor Equation:

$$\omega = \gamma B_o;$$

where $\gamma$ is the gyromagnetic constant which has a different value for different nuclei; and where $\omega$ is the Larmor frequency.

Briefly, in a typical NMR activity, a body coil is used to generate a plane polarized magnetic field in a plane perpendicular to the static magnetic field $B_o$. Such a field couples to the nuclei and excites them. The gradient coil system is used at the same time to modulate the static magnetic field $B_o$ such that a unique Larmor frequency is provided at different points in space. After the excitation is switched off, the nuclear spins relax back to the original state and in doing so, they generate signals at the Larmor frequency. These signals are then detected by the body coil and fed to the image reconstruction system.

Signal-to-noise ratio (SNR) of a receiver coil and the homogeneity of the magnetic field produced by it, are the two most important factors determining the image quality of an MRI system. In this regard, good image quality facilitates a successful clinical diagnosis. Also, a higher SNR results in faster MRI scans and in a higher patient throughput.

It is well known in the MRI field that a substantial improvement in SNR can be achieved by using a smaller coil, instead of the body coil, for detecting the signal. These coils are generally called surface coils or local coils. Such local coils are placed in close proximity to the area being imaged. The surface coils are suitably dimensioned to just cover an area of interest. It is also well known that, within limits, a smaller local coil will produce a higher SNR, however, the field of view (FOV) of such a smaller coil is also reduced.

The simplest surface coils are single loop coils of different diameters. Although such coils produce a high SNR, they also produce a very nonhomogenous field, which rapidly drops off as the distance between the loop and the volume being imaged increases. Accordingly, these single loop type surface coils are unsuitable for whole volume imaging. If two such coils are tuned to a frequency $F_0$ and brought close to each other in order to improve the homogeneity, there is a split in frequency response, reduction in sensitivity and a decrease in SNR.

Saddle coils, generally consisting of two oppositely disposed loops which enclose the volume being imaged, have been used to overcome the homogeneity shortcomings of the single loop coils. As best seen by reference to FIG. 1b, the splitting of frequency response of the two loops is overcome by connecting the coils in series with a crossover such that the direction of current is always the same in the two loops.

The RF fields provided by the above described single loop coils and saddle coils are linear fields, since they are orientated primarily in one direction, i.e., perpendicular to the face of the coils. FIG. 1a illustrates the flux lines generated by single loop coils and saddle coils.

Improvement in SNR performance also can be achieved by orienting two coils at 90° angles about the imaged object so that each detects RF energy along one of a pair of mutually perpendicular axes. This technique is generally known as quadrature detection, and the signals collected are termed quadrature signals. For signal processing, quadrature signals are summed together, using hybrid combiners, which phase shift one channel by 90° with respect to the other, and then add the signals. However, it is well known that the uncorrelated noise from the two channels does not add up like the signals. Instead, the uncorrelated noise from the two channels adds up to $\sqrt{2}$ times the value of the noise in one channel. Therefore, the SNR of the added signals is:

$$2S/\sqrt{2}N = \sqrt{2}S/N \approx 1.4S/N,$$

or, in other words, a 40% improvement over the SNR of a single channel, which is S/N.

As used herein, the term quadrature coil and quadrature signal, will refer to the detecting of the NMR signal along perpendicular axes, and combining the signals so collected, with the appropriate phase shifts, to produce a signal of improved signal-to-noise ratio.

An important consideration for quadrature coils is that the individual coils be electrically isolated from each other, i.e., they should produce fields that are truly orthogonal to each other. Only then will the noise picked up by them be uncorrelated. FIG. 2a shows a conductor geometry that generates quadrature fields. The simple loop generates the vertical field, while the figure eight shaped coil generates the horizontal fields. The horizontal fields rapidly die down as the distance, in a vertical direction, from the figure eight shaped coil is increased. Therefore, the quadrature gain area is very close to the coils. Accordingly, such an arrangement is not suitable for imaging over a large volume. Such coils are mainly employed for imaging planar anatomy that is very close to the coils, e.g. a spine.

FIG. 2b illustrates a coil pair which does not produce orthogonal fields, however, the individual coils are electrically well isolated. The direction of the flux lines in the overlap area is opposite to the direction of the flux lines in the nonoverlapped area. Isolation is achieved by overlapping the two coils such that the total flux coupling to a coil due to current flowing in the paired coil is zero.

In the past "bird cage" type coils have been employed for quadrature volume imaging. In a "bird cage" type coil, two conductive loops are spaced apart along a common longitudinal axis and interconnected by a series of regularly spaced longitudinal conductors. The impedance of the loops and of the longitudinal conductors is adjusted so that the coil may be excited into resonance by a rotating transverse magnetic field at the Larmor frequency. A quadrature signal may be obtained by monitoring the current through two longitudinal conductors spaced at 900 around the periphery of the loops. Such coils are described in detail in U.S. Pat. Nos. 4,680,548; 4,692,705; 4,694,255 and 4,799,016, hereby incorporated by reference.

When a bird cage coil is employed as a local coil, such as the coil disclosed in U.S. Pat. No. 5,370,118, the diameter of the loops and the length of the segments are reduced, so that the volume within the bird cage conforms closely to the imaged part. For the imaging of human limbs, and particularly for the imaging of the knee, the bird cage structure is dimensioned so that its cylindrical volume conforms closely to the outer surface of the leg.

In practice, the smallest practical radius of the bird cage is rarely realized for the reason that it is desired that the coil be suitable for imaging other members besides the knee, such as the foot. Imaging of the foot is preferably done with the foot in the anatomical position essentially perpendicular to the axis of the leg. The radial extension of the toes in this position limits how small the radius of the loops of the bird cage coil may be.

For this reason, the signal-to-noise ratio for bird cage coils intended for multipurpose imaging, including imaging of both the knee and foot, is significantly less than may be obtained for a coil not used for imaging the foot.

However, the application of a "bird cage" type coil is limited to cylindrical body parts that will fit inside the coil, e.g., a head or extremities. It is not possible to realize such a design for imaging odd shaped anatomy such as the shoulder. For such applications, a design that is open on one side such that the anatomy can be easily placed inside the coil is highly desirable.

Although present quadrature coil designs may operate with varying degrees of success, the opposing single loops of such quadrature coils couple strongly to each other and are not electrically isolated from each other. Accordingly, the quadrature gain of these coils is significantly reduced and costly preamplifiers must be employed to reduce the effects of mutual inductance.

The foregoing illustrates limitations known to exist in present NMR coils. Thus, it is apparent that it would be advantageous to provide an improved NMR coil, such as an open, quadrature, whole volume imaging surface coil array which has low mutual inductance between its individual coils, and which is directed to overcoming one or more of the limitations set forth above. Accordingly, a suitable alternative is provided including features more fully disclosed hereinafter.

SUMMARY OF THE INVENTION

The present invention advances the art of MRI or NMR surface coil arrays beyond which is known to date. In one aspect of the present invention, a general purpose quadrature whole volume NMR coil array is provided for obtaining an NMR signal from precessing nuclei within an imaging volume. The coil array comprises at least three figure eight shaped antenna coils. Each figure eight shaped antenna coil is electrically isolated from each other figure eight shaped antenna coil. The figure eight shaped antenna coils are arranged such that quadrature fields are generated by the antenna coils, and a region of quadrature gain is created within a predetermined volume between the figure eight shaped coils. The NMR coil array is open and is configured to selectively wrap about an object to be imaged It is a purpose of the present invention to provide an improved NMR surface coil.

It is another purpose of the present invention to provide an open, whole volume, general purpose, quadrature radio frequency surface coil array comprised entirely of figure eight shaped coils.

It is another purpose of the present invention to provide a quadrature radio frequency surface coil array which may be wrapped around an object to be viewed.

It is another purpose of the present invention to provide a quadrature radio frequency surface coil array comprised of at least three figure eight shaped coils, each of which is electrically isolated from the other coils to produce quadrature signals having improved signal-to-noise ratios.

It is another purpose of the present invention to provide a quadrature radio frequency surface coil array, comprised of a plurality of figure eight shaped coils, which does not require preamplifiers to minimize interactions between the coils.

BRIEF DESCRIPTION OF THE DRAWINGS

The foregoing summary, as well as the following detailed description of a preferred embodiment of the invention, will be better understood when read in conjunction with the appended drawings. For purposes of illustrating the invention, there is shown in the drawings an embodiment which is presently preferred. It should be understood, however, that the invention is not limited to the precise arrangement and instrumentality shown. In the drawings:

FIG. 5a illustrates a cutaway view of an antenna housing of the present invention revealing an antenna geometry on a flexible circuit;

FIG. 5b illustrates a wire line description of the antenna geometry of FIG. 5a;

FIG. 5c illustrates the flux generated in the X-Y plane by the antenna geometry of FIG. 5a;

FIG. 6 illustrates an alternate antenna configuration of the present invention;

DETAILED DESCRIPTION OF THE INVENTION

Figure 1A:
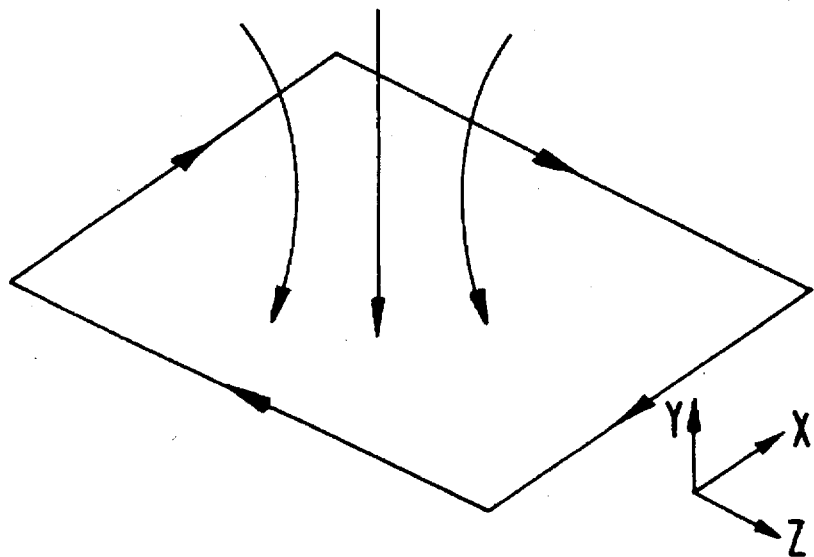
FIG. 1a illustrates the flux lines generated by a prior art single loop coil.
Figure 1B:
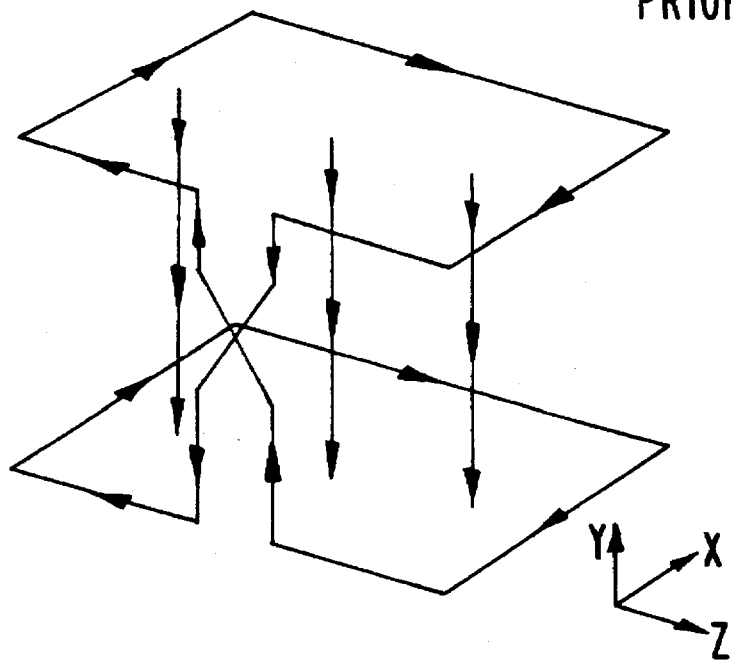
FIG. 1b illustrates the flux lines generated by a prior art saddle coil.
Figure 2A:
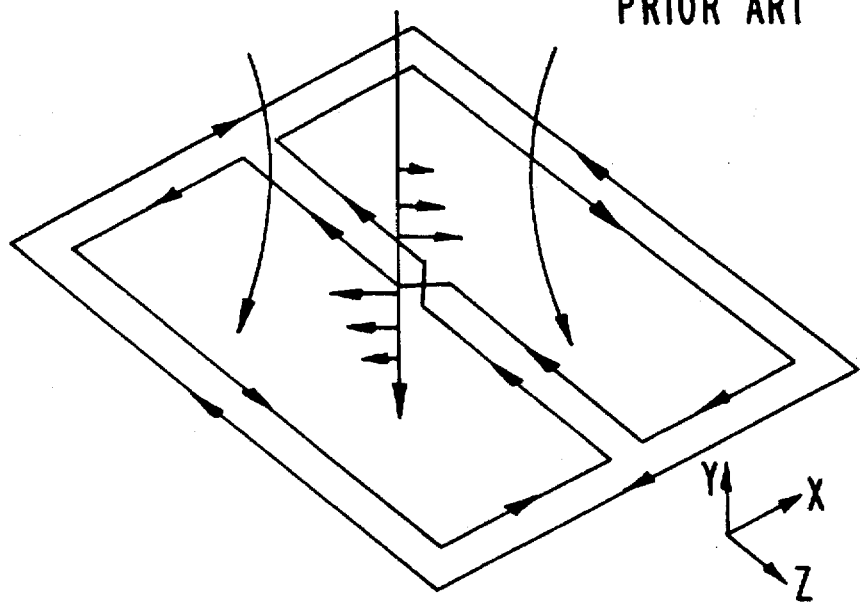
FIG. 2a illustrates the quadrature flux lines generated by a prior art loop and butterfly coil.
Figure 2B:
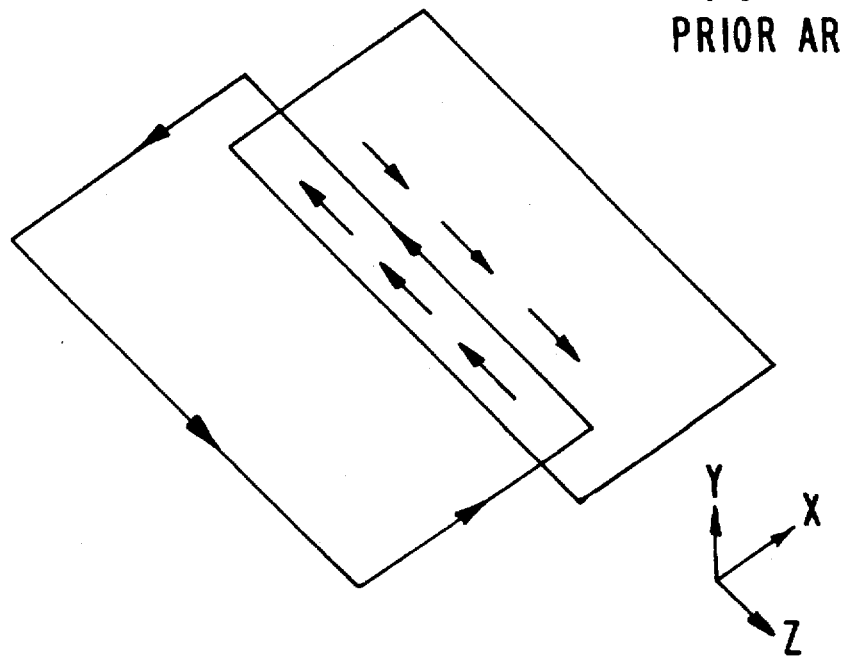
FIG. 2b illustrates the flux lines of a prior art coil pair.
Figure 3:
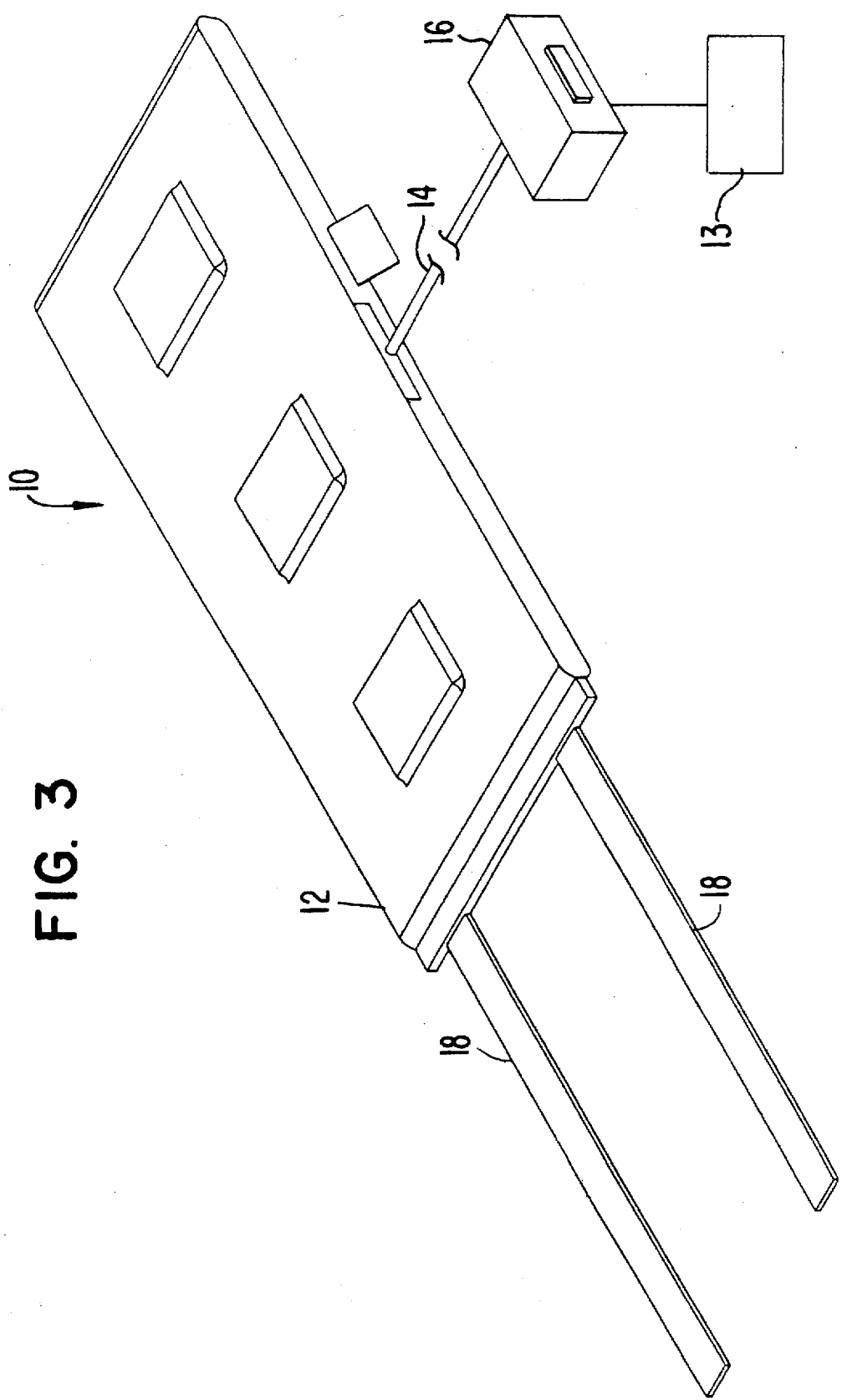
FIG. 3 is an environmental view of one embodiment of the apparatus of the present invention.

Referring now to the drawings, wherein similar reference characters designate corresponding parts throughout the several views, the open quadrature whole volume imaging NMR surface coil array of the present invention is generally illustrated at 10 in the Figures. As best illustrated in FIG. 3, the coil 10 includes a flexible antenna package 12, which is electrically connected to an MRI scanner (schematically represented at 13) by way of a cable assembly 14, and an interconnect device 16.

The flexible antenna package 12 houses the novel NMR coil array 10 of the present invention. The flexible antenna package 12 is fabricated from a suitable non-magnetic, non-conductive, low dielectric loss material, such as polymeric foam or fabric materials, or any other suitable materials. The cable assembly 14 may be comprised of a plurality of 50 ohm coaxial cables disposed in a soft, non-magnetic, non-conductive, low dielectric loss jacket material. In the illustrated embodiment of FIG. 8, three 50 ohm coaxial cables are provided. Each coaxial cable is electrically connected to an individual coil of the open quadrature whole volume imaging NMR coil array 10. The interconnect device 16 establishes electrical connection between the NMR coil array 10 and the MRI scanner 13. The interconnect device may include combiner electronics for adding channels, phase shifters for multichannel acquisitions, or coil identity electronics which permit the MRI scanner to recognize the NMR coil 10, and automatically load an appropriate software configuration.

Figure 4A:
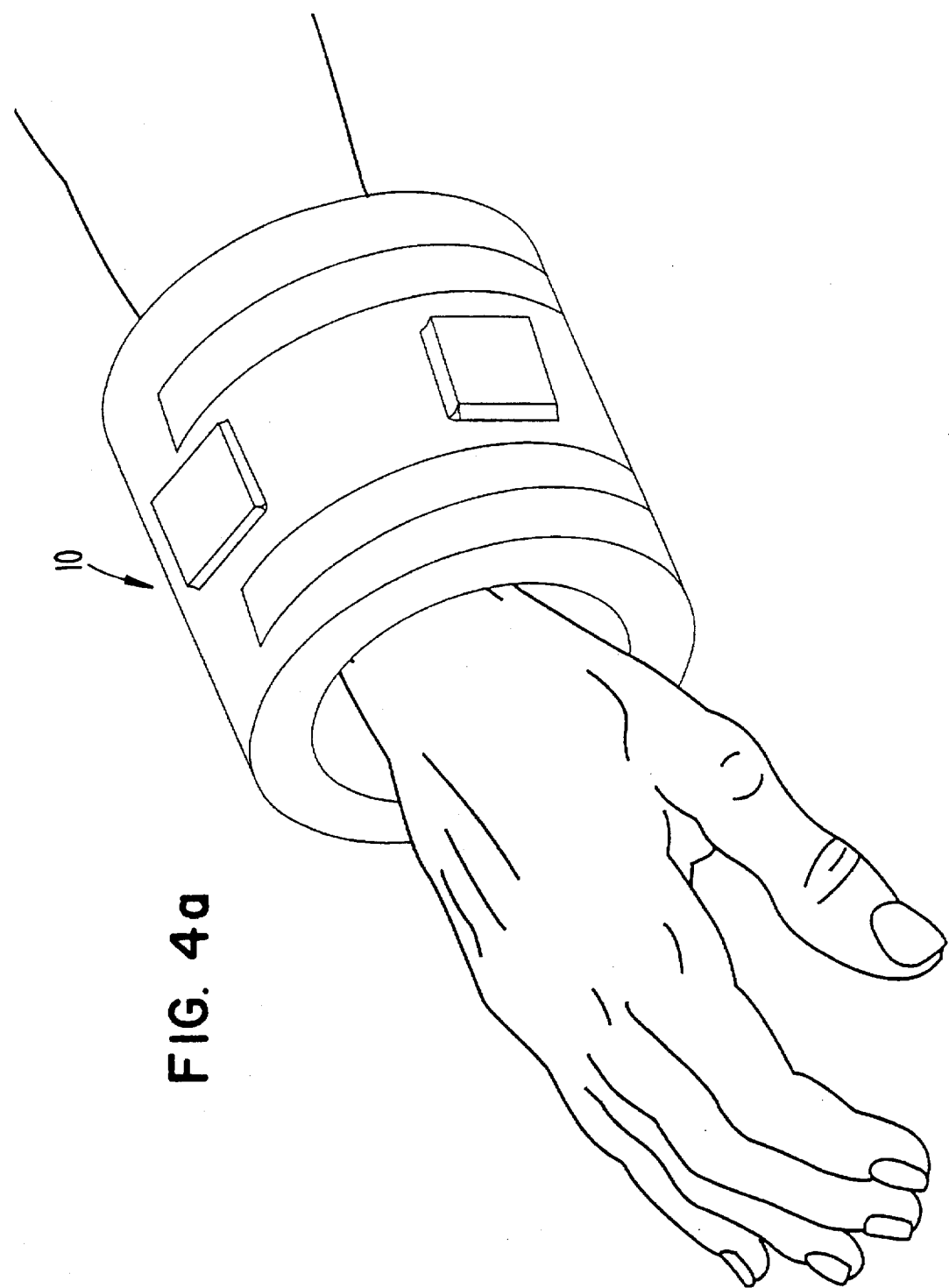
FIG. 4a illustrates the apparatus of FIG. 3 arranged for wrist imaging.
Figure 4B:
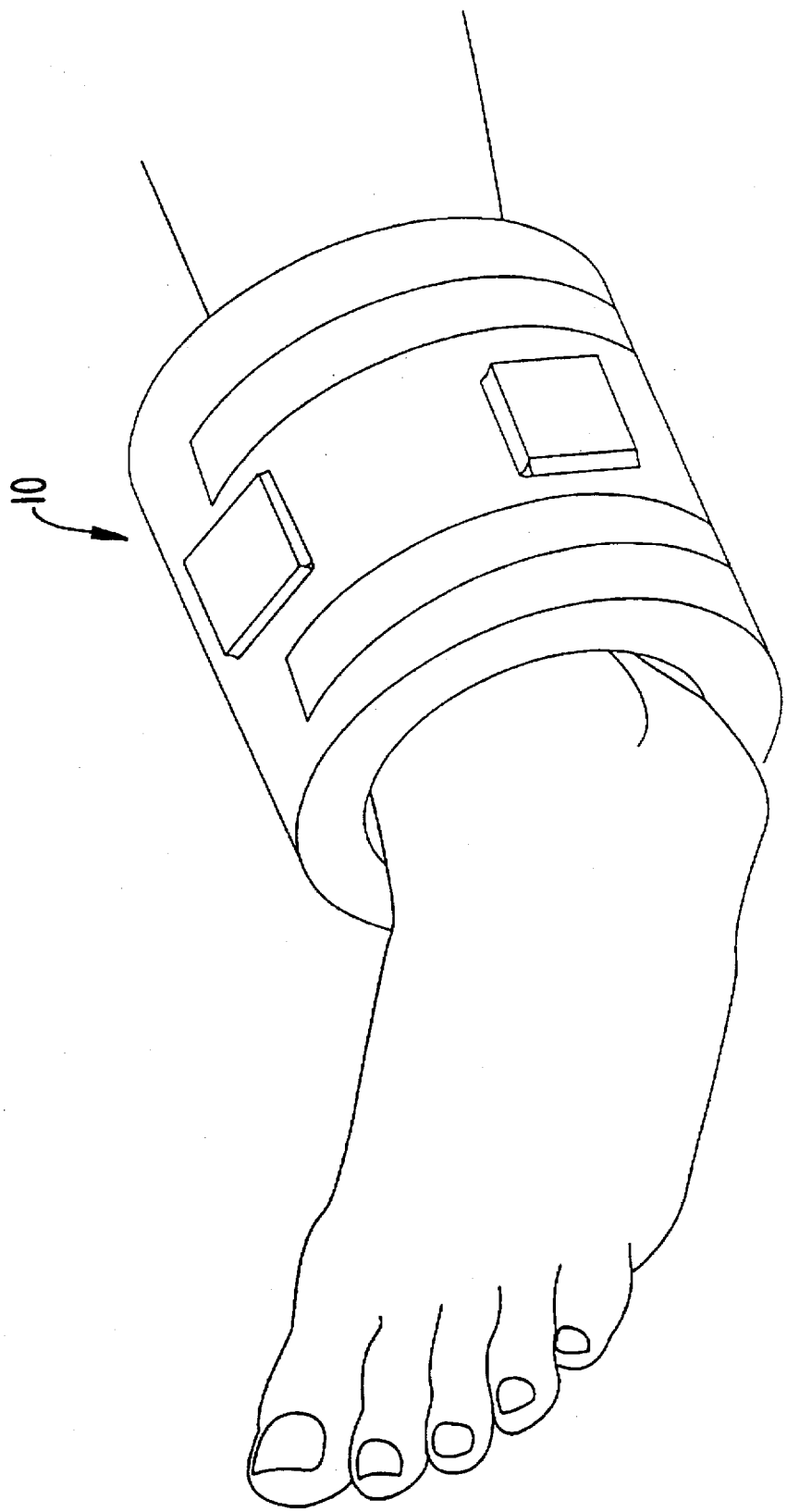
FIG. 4b illustrates the apparatus of FIG. 3 arranged for ankle imaging.
Figure 4C:
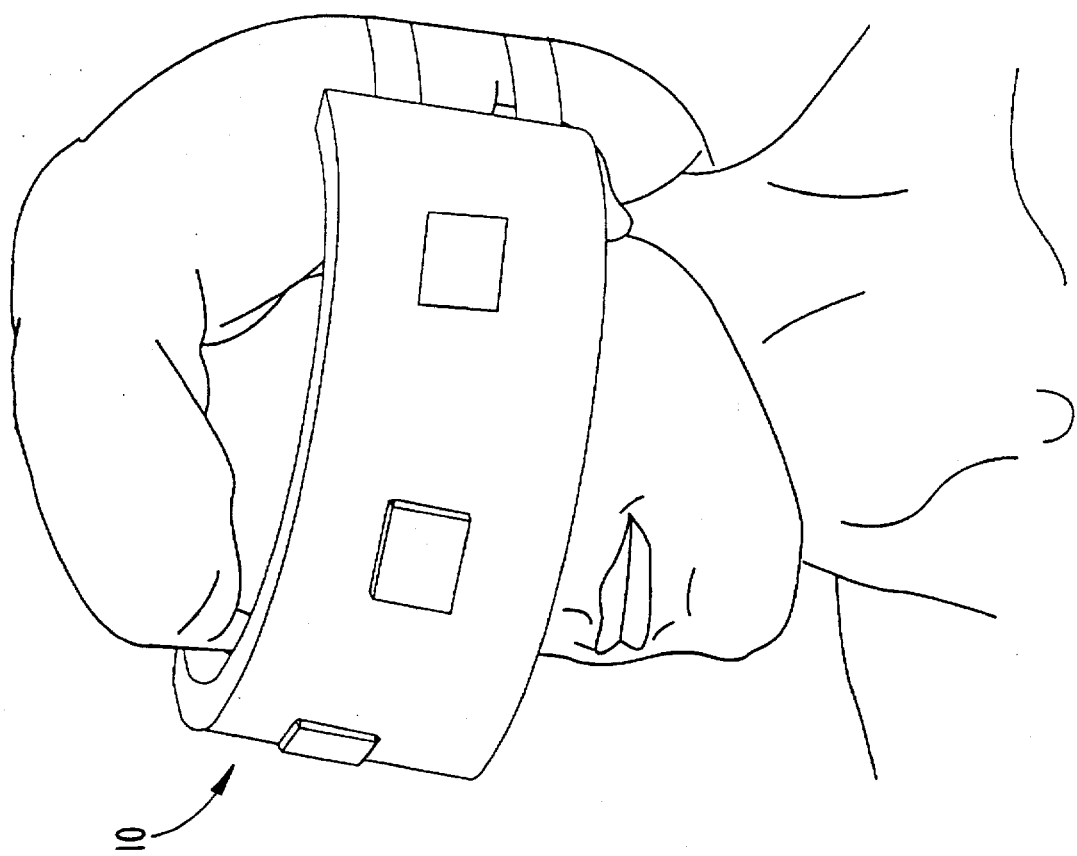
FIG. 4c illustrates the apparatus of FIG. 3 arranged for orbit imaging.

The flexible antenna package 12 may include a plurality of straps 18 for attachment to an object to be imaged. The straps 18 may include suitable fastener assemblies, such as but not limited to hook and pile type fasteners. FIGS. 4a, 4b and 4c generally illustrate the flexible antenna package 12 suitably attached to objects to be imaged. For example, in FIG. 4a the flexible antenna package 12 is attached to a patient's wrist; in FIG. 4b the flexible antenna package 12 is attached to a patient's ankle; and in FIG. 4c the flexible antenna package 12 is attached to a patient's head.

FIG. 5a illustrates a cutaway view of the flexible antenna package 12 to reveal the internal components thereof. Internally disposed within the flexible antenna package 12 is a flexible printed circuit board (PCB) 20, which has etched thereon antenna traces in accordance with the teachings of the present invention. As is explained in further detail hereinafter, the flexible antenna package 12 of the present invention is comprised entirely of figure eight shaped coils which are each electrically isolated from each other thereby eliminating the need for preamplifiers to minimize interactions between the coils. Two small figure eight shaped coils are illustrated at 32 and 34. A large figure eight shaped coil is illustrated at 36.

Rigid printed circuit boards are provided on the flexible printed circuit board 20 at 22, 24 and 26.

Rigid PCBs 22, 24 and 26 are electrically interconnected by way of 50 Ω coaxial cables 30.

Cable assembly 14 is electrically connected to rigid PCB 24 by way of a nonmagnetic connector. A suitable nonmagnetic connector may be obtained from E. F. Johnson Connectors, Part No. 142-0407.014.

Figure 5B:
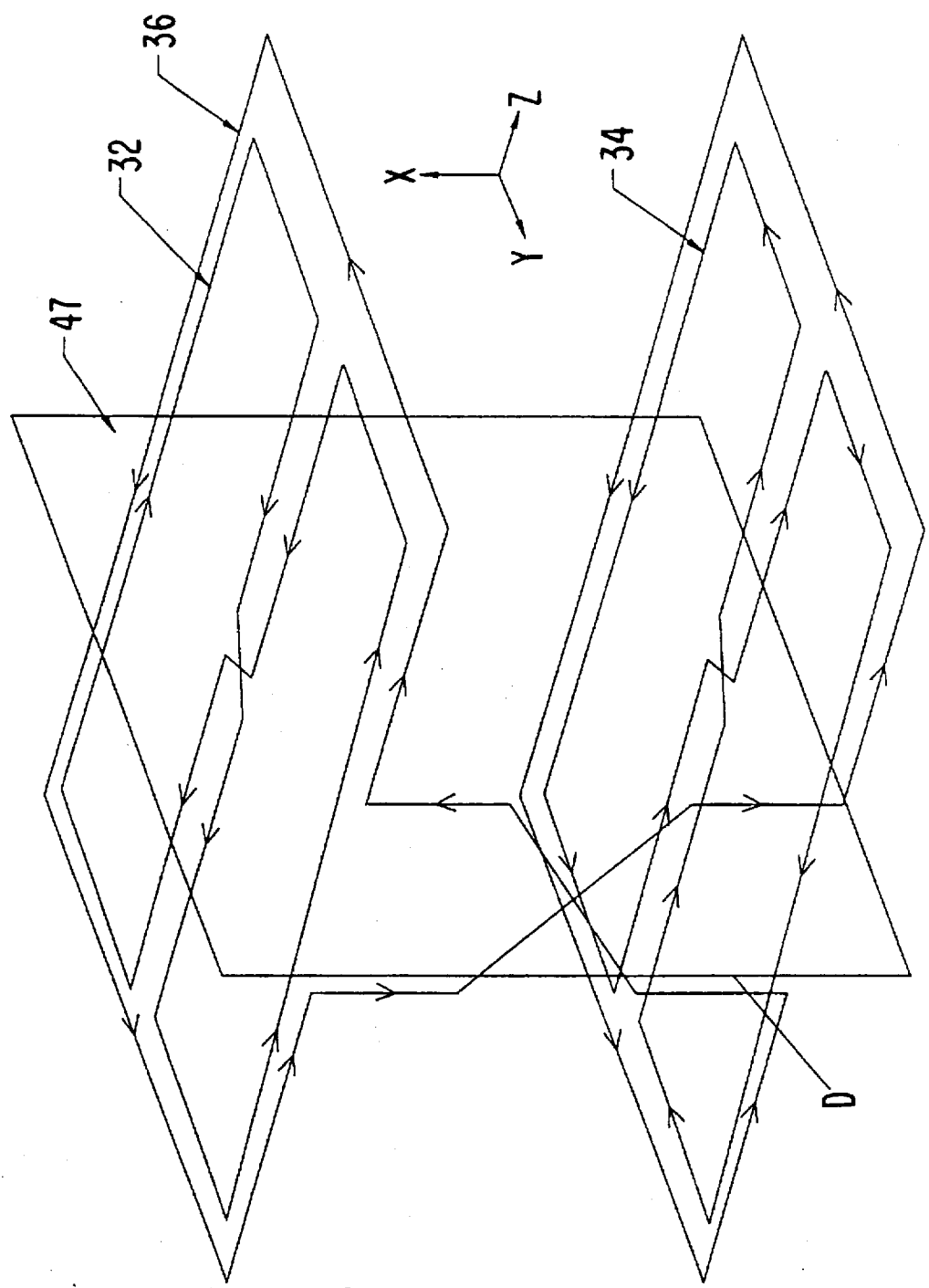

FIG. 5b illustrates a three dimensional wire diagram of the flexible antenna package 12 of FIG. 5a. The three dimensional wire diagram comprises two small figure eight shaped quadrature coils 32 and 34 which are oppositely disposed to each other. A large figure eight shaped quadrature coil is provided at 36. The large figure eight shaped coil is disposed such that each half thereof is arranged in an opposite facing orientation. Each of the small figure eight shaped quadrature coils 32 and 34 are disposed within a respective half of the large figure eight shaped quadrature coil 36.

Figure 5C:
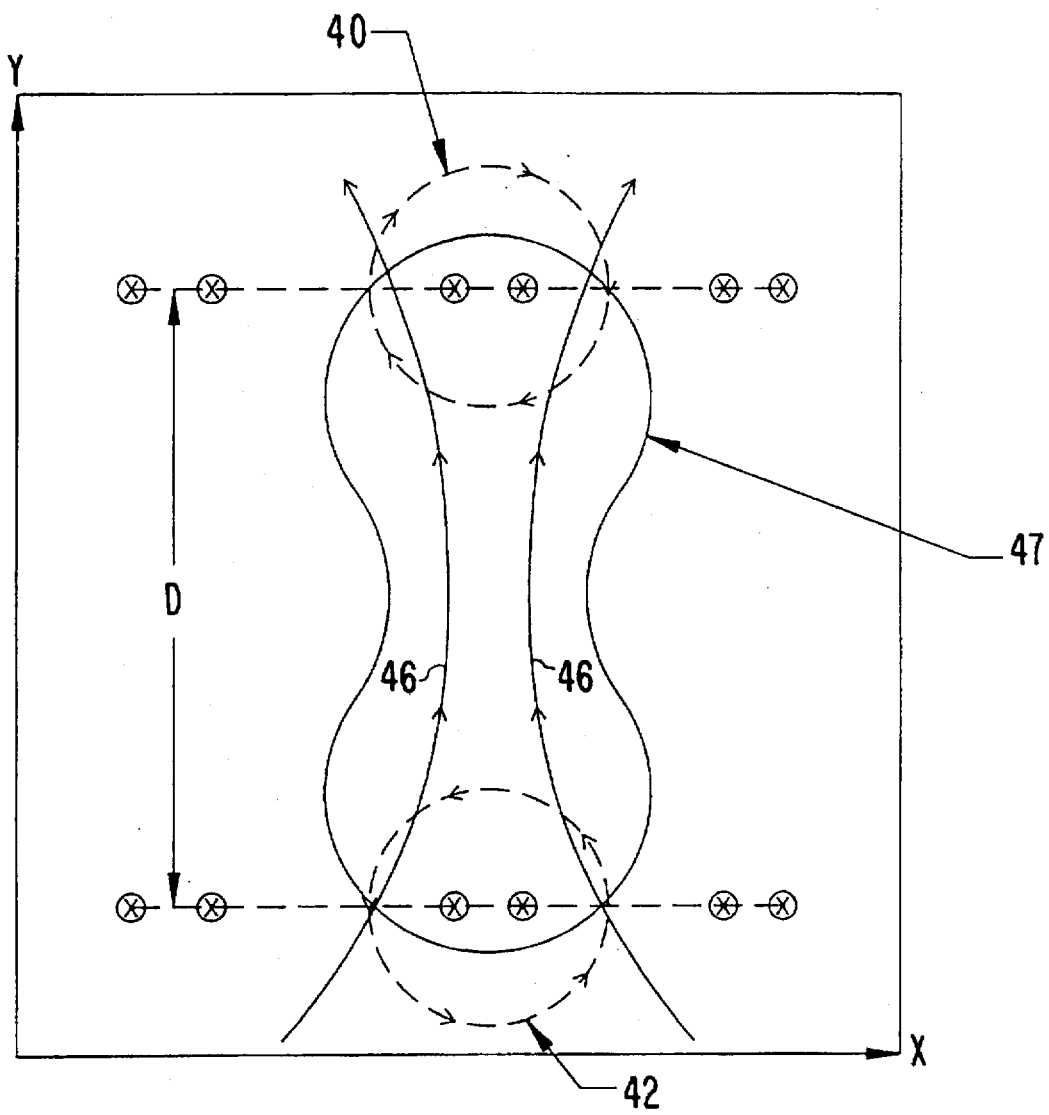

FIG. 5c is a diagram showing quadrature detection of the three figure eight shaped coils in a region of interest between the figure eight shaped coils. As illustrated therein, flux line 40 is generated by the small figure eight shaped quadrature coil 32 and flux line 42 is generated by the small figure eight shaped quadrature coil 34. Solid flux lines 46 are generated by the large figure eight shaped quadrature coil 36. As best understood by interpreting FIG. 5c, a region of quadrature gain is illustrated generally at 47. The flux lines 40 and 42 generated by the small figure eight shaped quadrature coils 32 and 34 are perpendicular to flux lines 46 generated by the large figure eight shaped coil 36. Therefore, the area of quadrature gain is defined generally at 47. As should be understood, the flux lines 40 and 42 weaken as the distance from the respective figure eight shaped quadrature coils 32 and 34 increases. The distance 'D', which is located between the two opposing halves of the large figure eight shaped coil 36 determines the shape of the quadrature gain area. As the distance 'D' decreases, the shape of the quadrature gain area changes from an hour glass shape to a more rectangular shape.

The teachings of the present invention may provide many alternate antenna configurations or antenna embodiments. For example, FIG. 6 illustrates an alternate antenna embodiment comprising four figure eight shaped quadrature coils 48, 50, 52, and 54. In this embodiment, quadrature coils 48 and 52 are electrically isolated from each other by using an overlapping technique. The static magnetic field $B_o$ produced by these quadrature coils is represented by the arrows. The length of the arrows is proportional to the magnitude of the field $B_o$ at that point, while the direction of the arrow is the same as that of the field. For a fixed imaging volume, the geometry of the embodiment of FIG. 6 offers the advantage of a higher SNR as compared with the embodiment illustrated in FIGS. 5a–5c. The embodiment of FIG. 6 comprises two large figure eight shaped quadrature coils covering the same volume to be imaged, instead of the one quadrature coil of the embodiment of FIGS. 5a–5c. Accordingly, the size of the figure eight shaped quadrature coils of FIG. 6 are smaller than the quadrature coils of FIGS. 5a–5c thereby providing a higher SNR.

Figure 7:
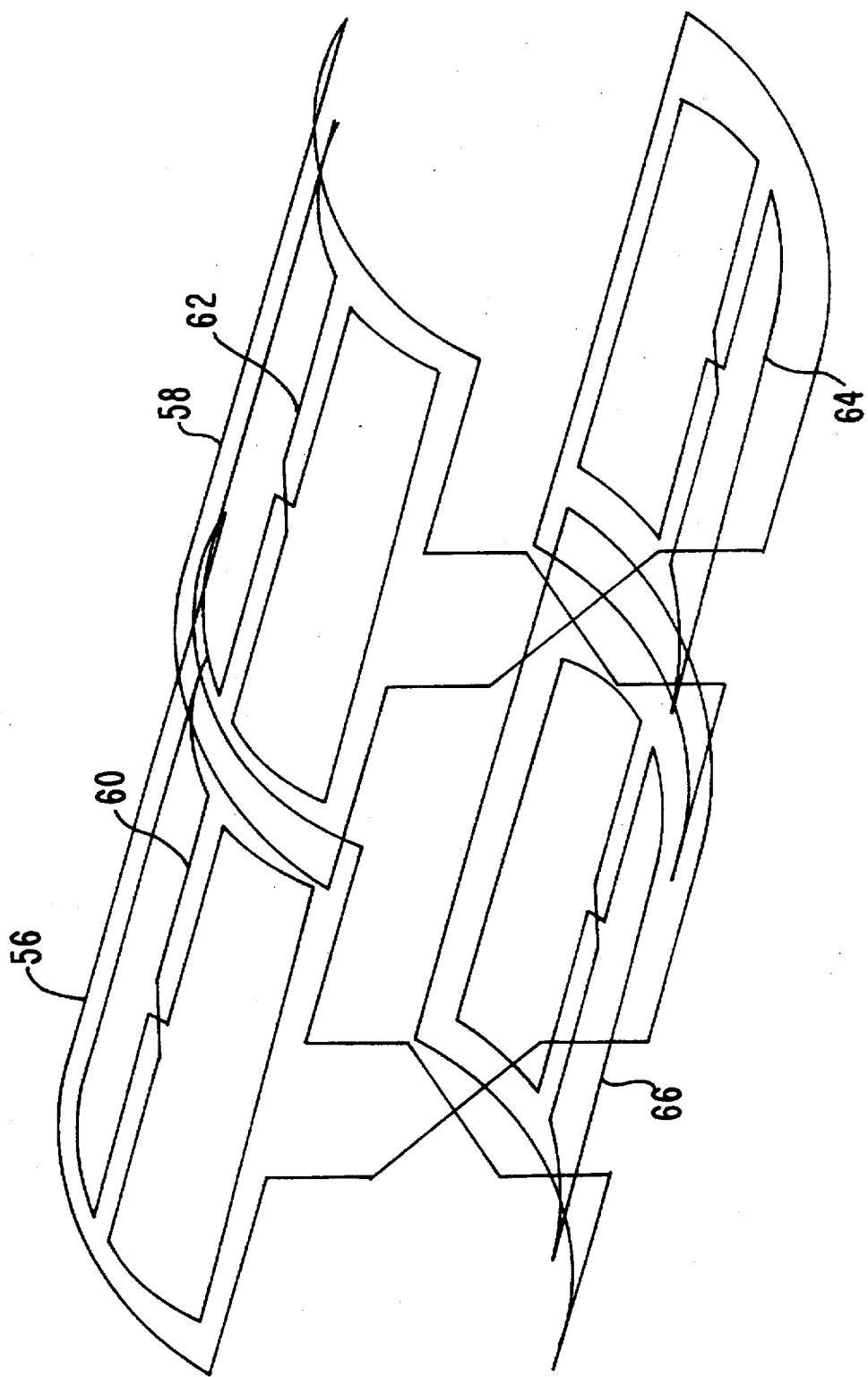
FIG. 7 illustrates an alternate antenna configuration of the present invention.

FIG. 7 illustrates yet another alternate embodiment of the open, whole volume, general purpose, quadrature radio frequency (RF) surface coil array 10 of the present invention. The embodiment of FIG. 7 comprises six figure eight shaped quadrature coils 56, 58, 60, 62, 64, and 66. For a fixed volume, the embodiment of FIG. 7 will provide an even higher SNR than the embodiments of FIGS. 5a–5c and FIG. 6.

Figure 8:
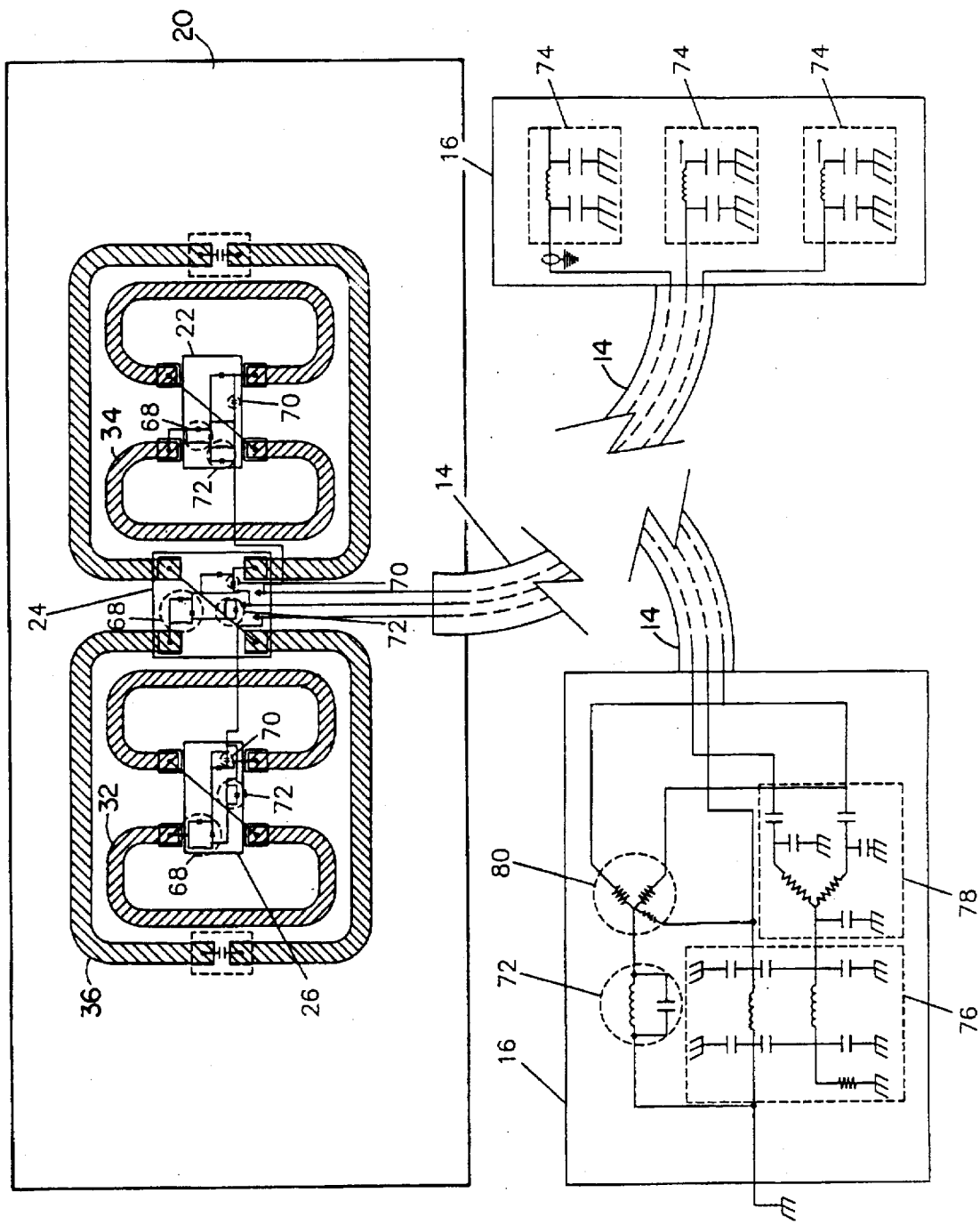
FIG. 8 illustrates a detailed electrical schematic of one embodiment of the present invention.

FIG. 8 illustrates a detailed electrical schematic of one embodiment of the present invention. As should be understood, the detailed electrical schematic is generally representative of all embodiments of the present invention, except that the below described components of the electrical schematic will be suitably multiplied as individual antennas are added to alternate embodiments.

The quadrature coils 32, 34 and 36 are disposed on the flexible PCB 20. Rigid PCBs 22, 24 and 26 are suitably attached to the flexible PCB 20, such as by rivets, for example. Each rigid PCB has a blocking circuit 68 which comprises a PIN type diode and an inductor tuned to a blocking capacitor. The PIN type diode is turned on by positive DC bias originating from the MRI scanner (not shown). Once the PIN diode is on, it open circuits a respective antenna coil. This is done automatically by the MRI scanner hardware when the body coil (not shown) is transmitting. Illustrated at 72 in each rigid PCB is an RF choke that permits a direct current through. Also, the RF choke 72 blocks any RF from passing through the choke. The matching capacitor 70 matches a respective antenna coil to 50 ohms when the antenna coil is employed on an average patient. Each quadrature antenna 32, 34 and 36 is electrically connected to the cable assembly 14.

As seen by the broken line arrangement of FIG. 8, the cable 14 may be terminated by at least two methods. More particularly, if the NMR coil array 10 is used for phased array operation, the interconnect device 16 comprises three phase shifters 74 which transform preamplifier impedance such that at the matching capacitor 70, an inductor is formed. In a receive mode, this inductor resonates with a matching capacitor or tuning capacitor to block the flow of current in a quadrature coil.

If the antenna coil 10 is used in a single quadrature mode, then the interconnect device comprises a zero degree combiner 78 for adding the two small figure eight coils 32 and 34, first, and then a 90 degree hybrid combiner 76 for adding the signals from coil 36 to the sum of 32 and 34. An additional DC bias splitting circuit 80 is provided for splitting the DC bias current for each of the three blocking networks.

Although a few exemplary embodiments of the present invention have been described in detail above, those skilled in the art readily appreciate that many modifications are possible without materially departing from the novel teachings and advantages which are described herein. Accordingly, all such modifications are intended to be included within the scope of the present invention, as defined by the following claims.

Having described the invention, what is claimed is:

1. A general purpose quadrature, whole volume NMR coil array for obtaining an NMR signal from precessing nuclei within an imaging volume, the coil array comprising:

at least three figure eight shaped antenna coils, wherein each figure eight shaped antenna coil is electrically isolated from each other figure eight shaped antenna coil, the said at least three figure eight shaped antenna coils being arranged such that quadrature fields are generated by two of said figure eight shaped antenna coils, and a region of quadrature gain is created within a predetermined volume between the figure eight shaped coils, wherein said NMR coil array is open and is configured to selectively wrap about an object to be imaged.

2. The general purpose quadrature, whole volume NMR coil array of claim 1, wherein the first and second figure eight shaped coils have a first predetermined dimension, and wherein said first and second figure eight shaped coils are oppositely disposed to each other.

3. The general purpose quadrature, whole volume NMR coil array of claim 2, wherein the third figure eight shaped coil has a second predetermined dimension which is greater than the first predetermined dimension of the first and second figure eight shaped coils, the third figure eight shaped coil being arranged such that each half thereof is disposed in an opposite facing orientation.

4. The general purpose quadrature, whole volume NMR coil array of claim 3, wherein each of the first and second figure eight shaped coils is disposed within a respective half portion of the third figure eight shaped coil.

5. An MRI surface coil array comprising:

at least three figure eight shaped antenna coils, wherein each figure eight shaped antenna coil is electrically isolated from each other figure eight shaped antenna coil, the said at least three figure eight shaped antenna coils being arranged such that quadrature fields are generated by two of said figure eight shaped antenna coils, and a region of quadrature gain is created within a predetermined volume between the figure eight shaped coils, wherein said NMR coil array is open and is configured to selectively wrap about an object to be imaged; and a flexible package for housing the at least three figure eight shaped antenna coils, wherein the flexible package is fabricated from a nonmagnetic, nonconductive, low dielectric loss material.

6. A NMR imaging system comprising:

an open, quadrature whole volume imaging surface coil array defined by at least three figure eight shaped antenna coils, wherein each figure eight shaped antenna coil is electrically isolated from each other figure eight shaped antenna coil, the said at least three figure eight shaped antenna coils being arranged such that quadrature fields are generated by two of said figure eight shaped antenna coils, and a region of quadrature gain is created within a predetermined volume between the figure eight shaped coils, wherein said NMR coil array is open and is configured to selectively wrap about an object to be imaged, the open, quadrature whole volume imaging surface coil array being housed in a flexible package fabricated from a nonmagnetic, nonconductive, low dielectric loss material;

an MRI scanner; and means for electrically connecting the open, quadrature whole volume imaging surface coil array to the MRI scanner.

7. A general purpose quadrature, whole volume NMR coil array for obtaining an NMR signal from precessing nuclei within an imaging volume, the coil array comprising:

a first antenna coil portion comprised of at least three figure eight shaped antenna coils, wherein each figure eight shaped antenna coil is electrically isolated from each other figure eight shaped antenna coil, the said at least three figure eight shaped antenna coils being arranged such that quadrature fields are generated by two of said figure eight shaped antenna coils, and a region of quadrature gain is created within a predetermined volume between the figure eight shaped coils; and at least a second antenna coil portion comprised of at least three figure eight shaped antenna coils, wherein each figure eight shaped antenna coil is electrically isolated from each other figure eight shaped antenna coil, the said at least three figure eight shaped antenna coils being arranged such that quadrature fields are generated by two of said figure eight shaped antenna coils, and a region of quadrature gain is created within a predetermined volume between the figure eight shaped coils, the first and at least second antenna coil portions being electrically isolated from each other; and wherein the first and at least second antenna portions are disposed in overlapping relation, and the general purpose quadrature, whole volume NMR coil array is open and is configured to selectively wrap about an object to be imaged.

8. A general purpose quadrature, whole volume NMR coil array for obtaining an NMR signal from precessing nuclei within an imaging volume, the coil array comprising:

at least first and second figure eight shaped antenna coils oppositely disposed in spaced apart parallel offset relation, wherein each figure eight shaped antenna coil is electrically isolated from the other figure eight shaped antenna coil, said first and second figure eight shaped antenna coils being arranged such that quadrature fields are generated by said antenna coils; and at least a third figure eight shaped coil arranged perpendicularly to the first and second figure eight shaped antenna coils such that a first portion of the third figure eight shaped coil is disposed about the first figure eight shaped antenna coil and a second portion of the third figure eight shaped coil is disposed about the second figure eight shaped antenna coil; and wherein a region of quadrature gain is created within a predetermined volume between said figure eight shaped coils, wherein said NMR coil array is open and is configured to selectively wrap about an object to be imaged.

* * * * *